United States Patent [19]

Kawakami

[11] Patent Number: 4,677,391
[45] Date of Patent: Jun. 30, 1987

[54] SERIES BIASING SCHEME FOR FIELD EFFECT TRANSISTORS

[75] Inventor: Kenneth Kawakami, Sunnyvale, Calif.

[73] Assignee: Microwave Technology, Inc., Fremont, Calif.

[21] Appl. No.: 861,165

[22] Filed: May 9, 1986

Related U.S. Application Data

[63] Continuation of Ser. No. 674,200, Nov. 23, 1984, Pat. No. 4,596,959.

[51] Int. Cl.$^4$ .......................... H03F 3/26; H03F 3/16
[52] U.S. Cl. ................................... 330/269; 330/277; 330/296
[58] Field of Search ................ 330/269, 273, 277, 296

[56] References Cited

U.S. PATENT DOCUMENTS 4,241,316 12/1980 Knapp ................................. 330/277

Primary Examiner—Gene Wan
Attorney, Agent, or Firm—Steven F. Caserza; Alan H. MacPherson; Kenneth E. Leeds

[57] ABSTRACT

A series biasing arrangement for a pair of junction field effect transistors (JFETs), which may be used in RF amplifiers, mixers or oscillators, comprises connecting the JFETs together in series, with the gates of the two JFETs selectively connected to different reference potentials. The first FET is also connected to the DC voltage source. In one embodiment of the invention, two operational amplifiers, whose output leads are connected to the gates of corresponding JFETs have their noninverting input leads connected to selected points on a voltage divider made up of three resistors and their inverting input leads each connected to the source of a corresponding JFET. The drain to source voltage drops across the JFETs are controlled solely by the values of two of the resistors in the three resistor voltage divider. The bias current through the series-connected JFETs can be controlled independently of the drain to source voltage drops across each of the JFETs. In either case, the two FETs need not be closely matched.

6 Claims, 7 Drawing Figures

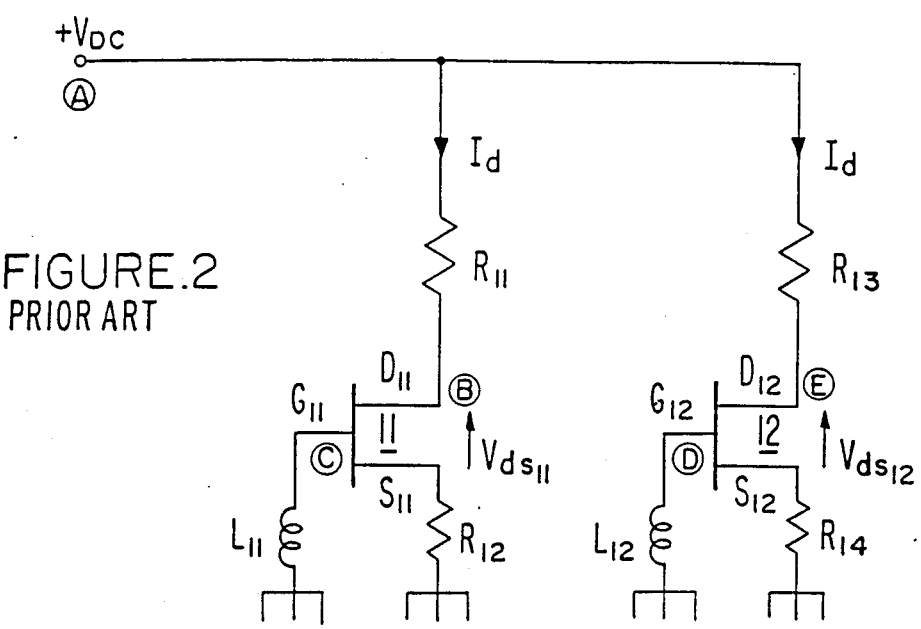
FIGURE.2
PRIOR ART
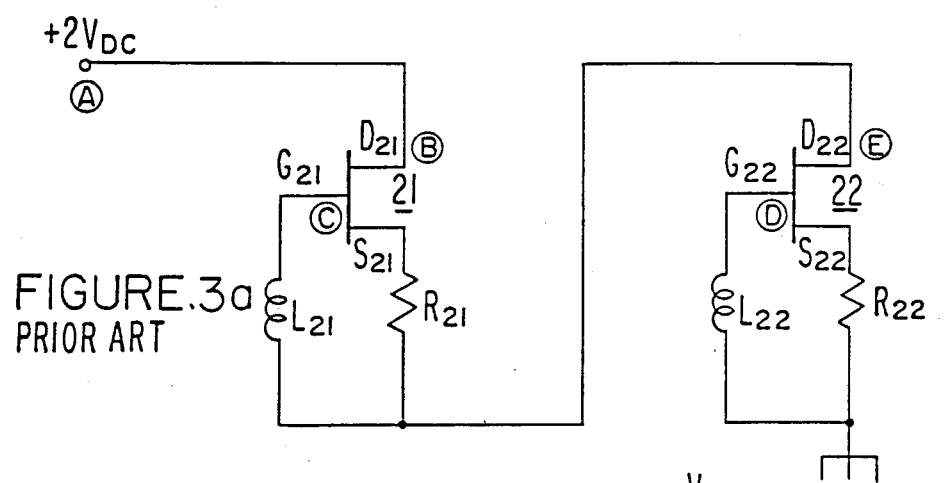
FIGURE.3a
PRIOR ART
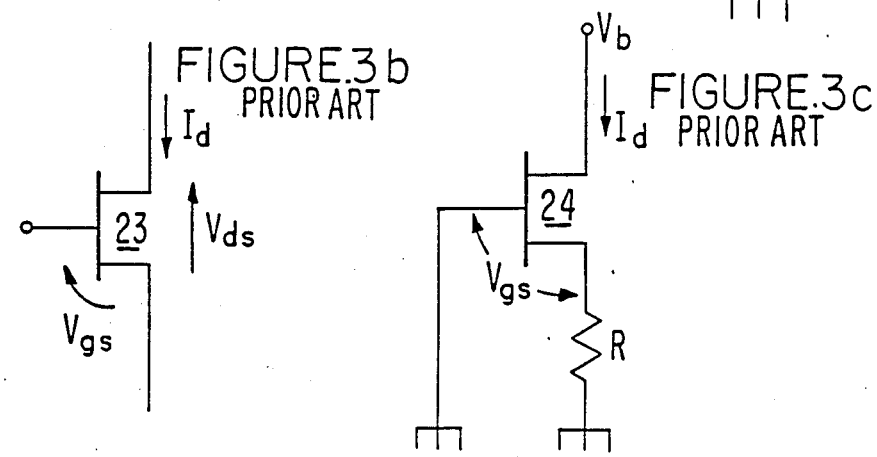
FIGURE.3b
PRIOR ART
FIGURE.3c
PRIOR ART

SERIES BIASING SCHEME FOR FIELD EFFECT TRANSISTORS

This application is a continuation of application Ser. No. 06/674,200, filed Nov. 23, 1984, now U.S. Pat. No. 4,596,959.

BACKGROUND

1. Field of the Invention

This invention relates to a biasing scheme for field effect transistors, hereinafter referred to as FETs, and more particularly to a series biasing scheme for a pair of FETs, particularly useful in the design of radio frequency (RF) amplifiers, mixers and oscillators for low current applications.

2. Description of the Prior Art

FETs are frequently employed as the active element in RF amplifiers. Mixers or oscillators may employ FETs as active devices as well. Since silicon devices generally do not operate at the high frequencies required, most microwave devices use N channel junction transistors made of gallium arsenide. It is also theoretically possible to manufacture P channel junction transistors of gallium arsenide. However, since the mobility of holes, which serve as the majority carriers in P channel devices, is much less than the mobility of electrons, which serve as the majority carriers in N channel devices, P channel devices are rarely used.

The FET devices must be turned on, or biased, with DC voltages so that they can linearly amplify an RF input signal. Certain amplifier designs, such as the balanced amplifier and the push-pull amplifier, where there are two identical branches connected so as to operate with specific phase relationships, require that the FETs be in pairs. The balanced amplifier configuration refers to a specific amplified topology, utilizing two matched active elements, that exhibits good input and output return loss characteristics. The push-pull configuration is similar to the balanced amplifier topology, employing 180° rather than 90° couplers. The prior art DC biasing scheme is to bias these pairs in parallel, thus requiring twice the DC current of any single FET.

A close matching of the FET pair is required in order to provide the proper biasing of a pair connected in series. Series biasing guarantees that the current across each of the FETs is equal because they share the same current. The drain to source voltages must also be equal. However, in general, a manufacturer cannot build a large number of JFETs with the same characteristics. The values of the pinch off voltage (Vp) and the saturated current ($I_{dss}$) associated with each JFET in a single wafer in which a plurality of JFETs are formed can typically vary by a factor of greater than 2 to 1 over the wafer. Therefore, in a passive biasing scheme, a factory adjusted resistor is needed to bias a given JFET to a given bias point. This adjustment involves time and money.

Roveti, in U.S. Pat. No. 3,656,025, describes a current limiter comprised of a pair of field effect transistors connected in series with a biasing resistor. One of the transistors has a lower cut-off potential than the other, and the one with the higher cut-off potential also has substantially higher resistance and can withstand much higher voltages. Roveti's device does not address the problem of unequal voltage drops across the two FETs. Rather, the operation of his device relies upon uneven voltage drops across the two series-connected field effect transistors.

A biasing arrangement, described by Yokoyama in U.S. Pat. No. 4,037,166, includes two complementary field effect transistors (FETs), connected in series with a constant current source. The gate bias voltages of the FETs are stabilized against fluctuations of the ambient temperature so that the operating points of these FETs will not fluctuate. Therefore, the operation of the amplifier in which they are employed remains unaffected by variations in temperature.

Yokoyama, U.S. Pat. No. 4,238,737, teaches a biasing arrangement comprising a pair of gate biasing resistors for field effect transistors forming a push-pull amplifier, and two constant current supplies having two output terminals for equal amounts of current to the transistors. Each constant current supply can be adjusted manually or automatically for setting a suitable operation point of the transistors and for balancing their bias voltages. The key is to balance the devices, i.e. to balance the gate to source bias voltages and provide the same current through the two current sources (see Yokoyama, column 2, lines 50 to 68). Such a push-pull amplifier employing a 180° hybrid coupler is seldom used in microwave technology. The more commonly used balanced amplifier, utilizing a 90° hybrid coupler, provides better input and output voltage standing wave ratios (VSWRs).

Sasaki, U.S. Pat. No. 4,433,303, discloses a push-pull amplifier circuit employing two field effect transistors of opposite conductivity type to each other which are activated by a common input signal to perform a push-pull operation. Secondary distortion components are cancelled out by impedance elements located between the source of each FET and a common reference potential point (Sasaki, column 2, lines 52 to 55). The apparatus makes use of a *complementary symmetry* within the circuit, so that whatever distortion is in one part of the circuit is cancelled out in the other part of the circuit. The main goal of Sasaki's invention is to reduce distortion.

SUMMARY

In accordance with the teachings of this invention, a series biasing scheme for field effect transistors is disclosed allowing the circuit to use half the current consumed by the parallel biasing of the prior art. Furthermore, a close matching of the FET pair is not required. While disclosed in combination with an RF amplifier, such a biasing scheme may be employed whenever biasing of a pair of FETs for a low current application is desired, such as in mixers or oscillators that employ FETs as the active devices. In accordance with this invention, the two FET devices are both N-channel JFETs, as such devices are most often used in microwave technology. However, the invention may be extended to the biasing of a P-channel JFET pair as well.

In one passive implementation of the biasing scheme, two N-channel JFETs are connected in series through a resistive element, the source of the first JFET being connected to the drain of the second JFET. The gate of the first JFET is connected between a first resistor and a second resistor connected in series. One lead of the first resistor is connected to the voltage source and one lead of the second resistor is connected to ground. The voltage source is also connected to the drain of the first JFET. The gate of the second JFET is connected directly to ground while its source is connected to ground through a resistor. In accordance with this invention, this arrangement accommodates different JFET characteristics so long as they are within a reasonable range (approximately 25%).

An active bias implementation of the invention comprises two N-channel JFETs biased in series. Three resistors are connected in series between a voltage source and ground. The drain of the first JFET is also connected to the voltage source. The source of the first JFET is connected directly to the drain of the second JFET while the source of the second JFET is connected through a fourth resistor to ground. The noninverting input leads of two operational amplifiers are connected between the first and second, and between the second and third resistors, respectively, of the three series connected resistors. The inverting input leads of the first and second operational amplifiers are connected directly to the sources of the first and second JFETs, respectively; the output leads of the first and second operational amplifiers are connected to the first and second JFET gates, respectively. The source of the second JFET and the second inverting input lead are connected together and through the fourth resistor to ground.

One of the objects of this invention is to provide a means to series bias the JFET pairs. A related object is to provide a JFET structure which requires one-half the current of the prior art parallel biasing arrangements. A lower biasing current makes possible RF amplifiers for applications in which the available DC bias current is limited, thus allowing JFET amplifiers to be used in low current applications. A third object is to provide a means to independently control the gate potential of one or more JFETs so as to make possible the series biasing of JFETs of unequal characteristics. This eliminates factory adjustment of the circuit employing the JFETs and thus saves time and money. These and other goals and features of this invention will become apparent from a reading of the detailed description of the invention taken in connection with the following drawings.

BRIEF DESCRIPTION OF THE DRAWINGS

FIG. 2 shows a prior art arrangement for DC biasing two JFETs in parallel;

FIG. 3(a) shows one method of series biasing a pair of JFETs, but which fails to solve the problem of having to closely match the JFETs;

FIG. 3(b) shows the schematic representation of a single JFET of the type used in this invention;

FIG. 3(c) shows the schematic representation of a single JFET of the type used in the parallel and series biasing schemes, which is further connected to ground;

DETAILED DESCRIPTION

The JFET series biasing arrangement of this invention, while disclosed in combination with an RF amplifier, may be used whenever biasing of JFETs is desired in low current applications, such as in mixers or oscillators that employ JFETs as active devices. While the embodiments of the invention described use N-channel JFETs, the invention may be used to bias P-channel JFETs, as well.

Figure 1:
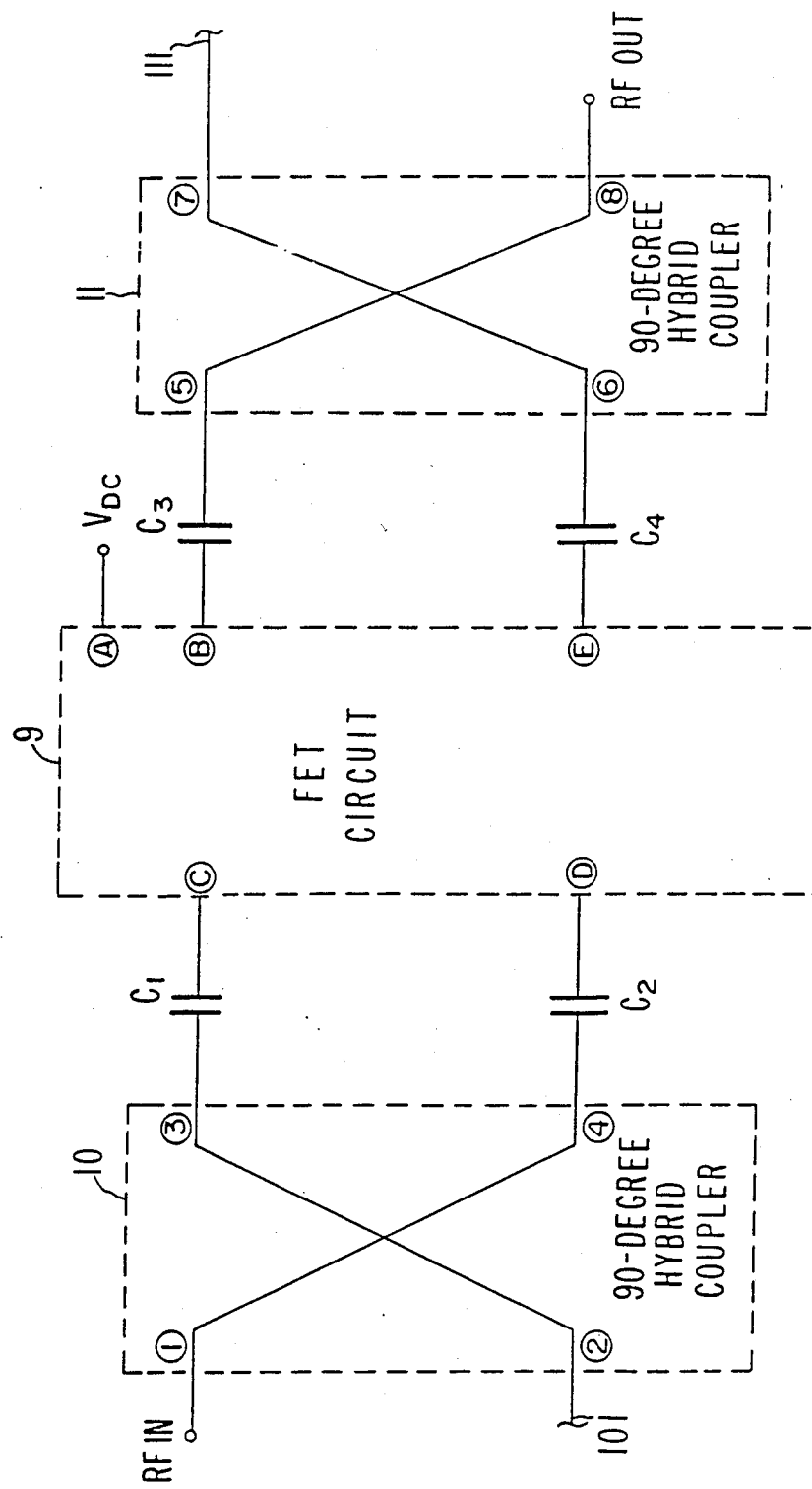
FIG. 1 shows a balanced configuration RF amplifier in which a FET biasing circuit is utilized.

FIG. 1 shows a balanced configuration RF amplifier in which an FET biasing scheme is utilized. The RF amplifier receives an RF input signal on input lead 1 which is then fed to 90° hybrid coupler 10. Input lead 2 is connected to an RF load 101. 90° hybrid couplers 10 and 11 serve to improve the return loss of the input and output leads 1 and 8 respectively. To reduce the return loss associated with a signal applied to inputs C or D of FET circuit 9, 90° hybrid coupler 10 acts so as to direct the return signal to RF load 101 attached to lead 2 rather than to input lead 1. 90° hybrid coupler 10 provides RF signals on leads 3 and 4 which are capacitively coupled through capacitors C1 and C2, respectively, to input leads C and D of FET circuit 9. FET circuit 9 provides amplified RF signals on its output leads B and E which are capacitively coupled via capacitors C3 and C4 to input leads 5 and 6 of 90° hybrid coupler 11. Coupler 11 recombines the 90°-out-of-phase signals coming from leads B and E to place them in phase at output lead 8. When B and E have identical impedances, coupler 11 also directs the return signal from output lead 8 to RF load 111 connected to lead 7 of coupler 11. The 90° hybrid coupler 11 provides on its output lead 8 an RF output signal which is an amplified version of the RF input signal applied to input lead 1. A ground potential is applied to a ground plane not shown in FIG. 1 but well known to those skilled in the art. FET circuit 9 includes input lead A for receiving DC bias voltage which serves to establish the bias point of the field effect transistors contained within FET circuit 9, as will be more fully described later. The design theory of balanced transistor amplifiers is described in a paper by K. Kurokawa entitled "Design Theory of Balanced Transistor Amplifiers" published in Bell System Technical Journal, Vol. 44, No. 8, pgs. 1675 to 1698, in October, 1965.

The push-pull amplifier configuration is similar to FIG. 1 except that the hybrids 10 and 11 are 180° couplers rather than 90° couplers.

The use of letters A, B, C, D and E in FIGS. 2 through 5 refer to the points of the FET circuits shown in these Figures which correspond to the identically lettered connections to the RF amplifier configuration shown in FIG. 1.

FIG. 2 shows the prior art DC parallel biasing of a JFET pair. JFETs 11 and 12 are formed on a common or separate semiconductor substrate by known semiconductor integrated circuit techniques. JFETs 11 and 12 each have their gates $G_{11}$ and $G_{12}$ connected to ground through inductor $L_{11}$ and $L_{12}$, respectively. Drains $D_{11}$ and $D_{12}$ of JFETs 11 and 12 are connected to resistors $R_{11}$ and $R_{13}$, respectively, which are then connected to bias terminal A. Resistors $R_{12}$ and $R_{14}$ connect sources $S_{11}$ and $S_{12}$, respectively, to ground. In practice, inductors $L_{11}$ and $L_{12}$ are required between gate $G_{11}$ and ground, and gate $G_{12}$ and ground, respectively, to prevent short circuiting of the RF signal which is applied to these gates. This bias scheme requires adjustment of $R_{11}$ and $R_{12}$ for JFET 11, and $R_{13}$ and $R_{14}$ for JFET 12 so that the DC current $I_d$ and the drain to source voltages $V_{ds11}$ and $V_{ds12}$ will be equal across both JFET 11 and JFET 12.

FIG. 3(a) shows one method of series biasing JFETs 21 and 22. Drain $D_{21}$ of JFET 21 is connected to DC voltage source $2V_{DC}$. Source $S_{21}$ of JFET 21 is connected to resistor $R_{21}$, which is connected to inductor $L_{21}$ which in turn connects to gate $G_{21}$ of JFET 21. Resistor $R_{21}$ and inductor $L_{21}$ are connected to drain $D_{22}$ of JFET 22. Source $S_{22}$ of JFET 22 is connected to a second resistor $R_{22}$. Inductor $L_{22}$ is connected to gate $G_{22}$. Resistor $R_{22}$ and inductor $L_{22}$ are connected in common to ground. The total bias current required from the DC supply is one-half the bias current required for the parallel JFETs of FIG. 2. However, the DC voltage required is twice as high. In addition, in order to work, the arrangement of FIG. 3(a) requires an unacceptably close matching of the JFETs. Considering the present state of the art of device fabrication, it is unreasonable to expect two JFETs to have the substantially identical characteristics required for this biasing arrangement.

The required matching of the two JFETs biased in series may be shown analytically referring to FIG. 3(b). A first order, linear approximation of JFET 23 biased in the linear region is given by $$I_d = I_{dss} + G_m V_{gs} \quad (1)$$

where $I_d$ is the current supplied by the DC power source; $V_{gs}$ is the value of the gate to source voltage; and $I_{dss}$ and $G_m$ are values which characterize the JFET, $G_m$ being the transconductance of the device and $I_{dss}$ the drain to source saturation current. Under normal bias conditions, $V_{gs}$ is a negative number. Given the approximation of Equation (1), the value of $I_d$ is independent of the value of $V_{ds}$, the drain to source voltage, because all three terms in Equation (1), $I_{dss}$, $G_m$ and $V_{gs}$ are independent of $V_{ds}$.

Now consider the arrangement of FIG. 3(c). The relevant equation is $$V_{gs} = -I_d R \quad (2)$$

Substituting this value of $V_{gs}$ into Equation (1) yields $$I_d = I_{dss}/(1 + G_m R) \quad (3)$$

Thus, the current $I_d$ supplied by the DC power supply is independent of the value of the voltage $V_b$. With respect to the DC power supply the circuit of FIG. 3(c) maintains a constant current whose value may be determined from Equation (3).

FIG. 3(a) shows two such constant current load FET devices, 21 and 22, in series. In light of Kirchhoff's current law, which teaches that the algebraic sum of the currents toward any point in a network is zero, such a condition is impossible unless both constant current loads maintain exactly the same current levels. If the two FETs are even slightly mismatched, one or both of the FETs 21 and 22 become biased in the nonlinear region and Equation (1) is no longer valid. The bias voltage across each of FETs 21 and 22 will be significantly different.

Figure 4:
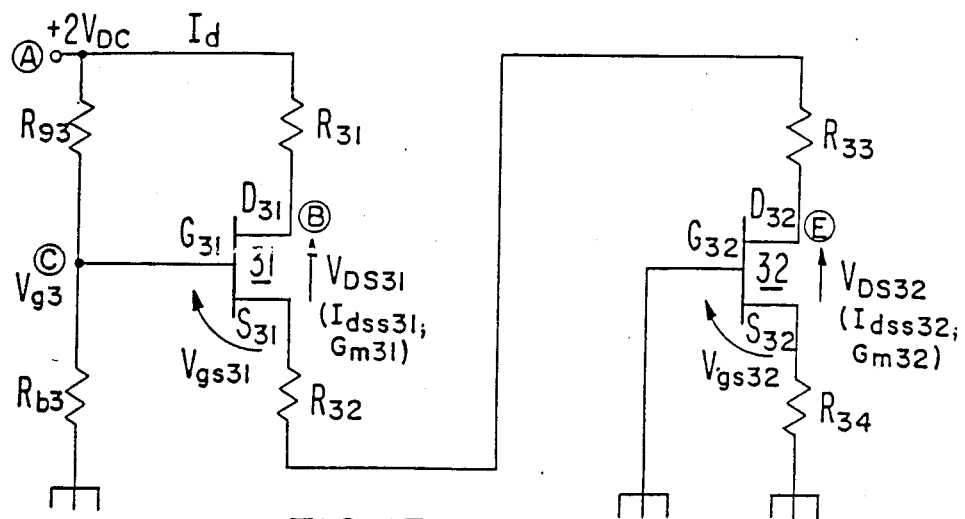
FIG. 4 shows one embodiment of the DC bias circuitry of the present invention, utilizing passive bias implementation.

FIG. 4 shows a passive bias implementation of the present invention using a series biasing scheme for a pair of JFETs. Resistors $R_{a3}$ and $R_{b3}$ are connected in series to form a voltage divider between a DC voltage source $2V_{DC}$ and ground. The node (c) between resistors $R_{a3}$ and $R_{b3}$ is connected to gate $G_{31}$ of JFET 31. A resistor $R_{31}$ is connected between voltage source $2V_{DC}$ and drain $D_{31}$ to locally adjust the drain to source voltage of JFET 31. If desired, $R_{31}$ may be omitted. Source $S_{31}$ of JFET 31 is connected to one lead of resistor $R_{32}$. The other lead of resistor $R_{32}$ is connected to resistor $R_{33}$. Resistor $R_{33}$ is further connected in series with drain $D_{32}$ of JFET 32. Two resistive elements, $R_{32}$ and $R_{33}$, are used in this embodiment for purposes of illustration and comparison. In the embodiment of this invention shown in FIG. 4, a single resistor may also be employed. In the RF circuit, gate $G_{32}$ of JFET 32 is connected to ground through an inductor (not shown in FIG. 4). An inductor is required between gate $G_{32}$ and ground to avoid shorting RF current to ground. Source $S_{32}$ of JFET 32 is connected through resistor $R_{34}$ to ground. JFET 31 is characterized by saturation current $I_{dss31}$ and transconductance $G_{m31}$; JFET 32 is characterized by saturation current $I_{dss32}$ and transconductance $G_{m32}$.

In this embodiment, $R_{a3}$ is equal to $R_{b3}$, and can be made quite large (~10 K$\Omega$) so as to consume a minimum amount of current from the DC source $2V_{DC}$. By connecting a potentiometer (not shown) in parallel with $R_{a3}$ or $R_{b3}$, the value of $R_{a3}$ or $R_{b3}$ may be varied so as to compensate for variations in the characteristics of JFETs 31 and 32.

The DC drain current $I_d$ is determined by JFET 32 according to the following equation:

$$I_d = (I_{dss} 32)/(1 + G_{m32} R_{34}) \quad (4)$$

Since $R_{a3} = R_{b3}$ and the supply voltage is $2V_{DC}$, then $$V_{g3} = V_{DC} \quad (5)$$

Referring to FIG. 4, $$V_{g3} = V_{gs31} + 2V_{DC} - V_{DS31} - I_d R_{31} \quad (6)$$

From equation 1, $$I_d = I_{dss31} + G_{m31} V_{gs31} \quad (7)$$

Combining equations 5, 6 and 7 yields $$V_{DC} = V_{DS31} - (I_d - I_{dss31})/G_{m31} + I_d R_{31} \quad (8)$$

Because supply voltage $V_{DC}$ is constant, Equation (8) shows that the parameters of JFET 31, $I_{dss31}$ and $G_{m31}$ are related to the bias voltage $V_{DS31}$ across FET 31. Thus, any changes in $I_{dss31}$ and $G_{m31}$ will cause a variation in $V_{DS31}$ in accordance with Equation (8). The circuit of FIG. 4 thus is sensitive to JFET parameters, but not to the extent the circuit of FIG. 3(a) reflected in Equation (3) is sensitive to these parameters.

Resistors $R_{31}$, $R_{32}$, $R_{33}$ and $R_{34}$ are adjusted in a manner identical to the adjustments of $R_{11}$, $R_{12}$, $R_{13}$ and $R_{14}$ in FIG. 2 to obtain the same drain to source bias voltage across JFET 31 as across JFET 32. However, the DC bias current required in this invention is one half of that required in the prior art depicted in FIG. 2 as, in the present invention, the two FETs are connected in series rather than in parallel with each other. This biasing scheme accommodates different JFET characteristics so long as these characteristics are reasonably well matched (i.e., differ by no more than about 25%). A trade-off between the variations in these characteristics is also possible. The bias circuit of FIG. 4 does not result in a perfect match of the drain to source voltages across the two JFET transistors, but the values do come within 20%. Such a close match is achieved by using a separate bias point for the first FET 31. Furthermore, $R_{a3}$ and $R_{b3}$, or the required gate voltage $V_g$, may be readjusted if necessary.

Figure 5:
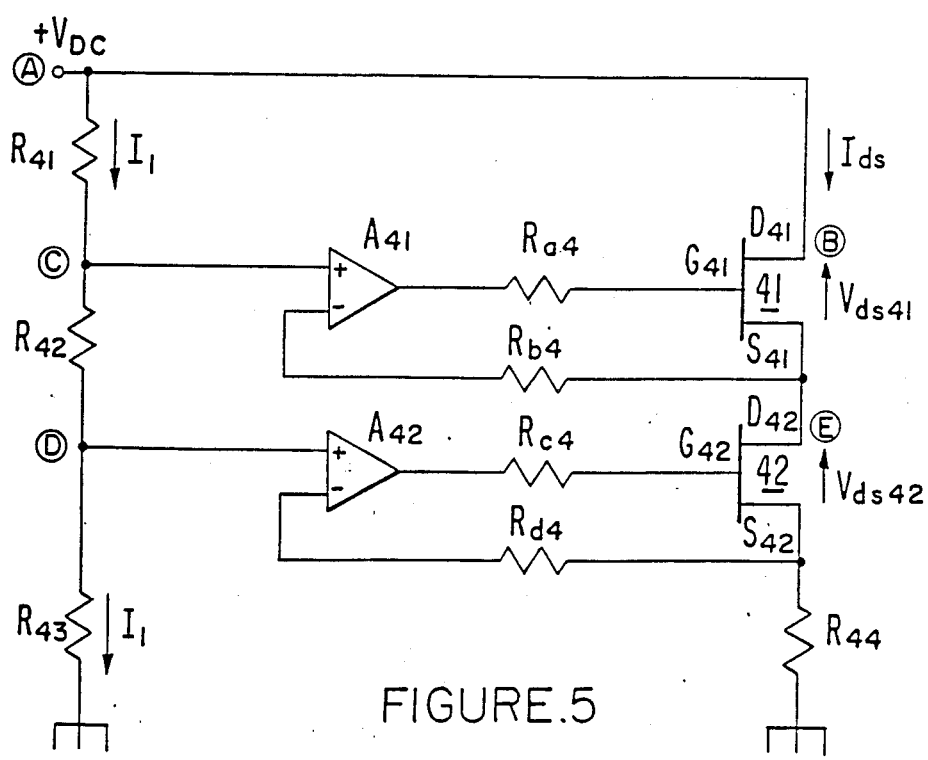
FIG. 5 shows an alternative embodiment of the present invention utilizing active bias implementation.

An active implementation of the present invention is depicted in FIG. 5. Here, again, two N-channel JFETs 41 and 42 are biased in series. Three resistors $R_{41}$, $R_{42}$ and $R_{43}$ are connected in series between a DC voltage source $V_{DS}$ and ground with resistor $R_{43}$ being connected to ground. Resistor $R_{41}$, and drain $D_{41}$ of JFET 41, are both connected to voltage source $V_{DC}$.

The output voltage of operational amplifier $A_{41}$ is applied to gate $G_{41}$ of JFET 41 through resistor $R_{a4}$. The noninverting input lead of operational amplfier $A_{41}$ is connected to the node (c) between resistors $R_{41}$ and $R_{42}$. The inverting input lead of amplifier $A_{41}$ is connected through resistor $R_{b4}$ to the source $S_{41}$ of JFET 41 and to the drain $D_{42}$ of JFET 42. The output lead of operational amplifier $A_{42}$ is connected to resistor $R_{c4}$, which is connected to gate $G_{42}$ of JFET 42. The noninverting input lead of operational amplifier $A_{42}$ is connected to node (d) between resistor $R_{42}$ and $R_{43}$; the inverting input lead of operational amplifier $A_{42}$ is connected to resistor $R_{d4}$ which in turn is connected to source $S_{42}$ of JFET 42. Source $S_{42}$ is connected through resistor $R_{44}$ to ground. $V_{DS42}$ is the voltage from drain $D_{42}$ to source $S_{42}$ across JFET 42; $V_{DS41}$ is the voltage from drain $D_{41}$ to source $S_{41}$ across JFET 41.

Resistor $R_{43}$ controls the current through JFETS 41 and 42. The values of resistors $R_{41}$, $R_{42}$, and $R_{43}$ are held high so that these three resistors in series draw only a small current. Operational amplifiers $A_{41}$ and $A_{42}$ have high input impedances, and the voltages on their inverting input leads can be considered equal to the voltages on their noninverting input leads. No steady state current flows through resistors $R_{a4}$ through $R_{d4}$. Therefore, the voltage drop across $R_{41}$ equals drain to source voltage $V_{DS41}$ across JFET 41, and the voltage drop across $R_{42}$ equals the drain to source voltage $V_{DS42}$ across JFET 42. Resistor $R_{41}$ and $R_{42}$ are always chosen to be equal to each other so that the drain to source voltages across JFETs 41 and 42 will be equal. In one embodiment of FIG. 5, the values of $R_{41}$ and $R_{42}$ each are approximately 3K ohms.

Resistors $R_{a4}$, $R_{b4}$, $R_{c4}$ and $R_{d4}$ are decoupling resistors and not critical. Biasing current $I_{ds}$ flows from DC voltage source $V_{DC}$ through series-connected JFETs 41 and 42 to ground. Assuming an ideal operational amplifier (i.e., an amplifier with high input impedance and high gain), the voltage on the noninverting input lead of each of the operational amplifiers, $A_{41}$ and $A_{42}$, is equal to the voltage on its inverting input lead. In one embodiment, the voltage gain of each of operational amplifiers $A_{41}$ and $A_{42}$ is equal to 60 DB. The biasing arrangement of FIG. 5 requires no adjustment of any of the resistors $R_{41}$ through $R_{44}$ to obtain the desired bias voltage drops $V_{DS41}$ and $V_{DS42}$ across JFETs 41 and 42 and to obtain the desired biasing current $I_{ds}$, provided, of course, that resistors $R_{41}$ and $R_{42}$ are equal to each other.

In the embodiment of FIG. 5, assuming $A_{41}$ and $A_{42}$ are ideal operational amplifiers, the current $I_l$ passes through resistors $R_{41}$, $R_{42}$ and $R_{43}$. Because the voltage on the inverting input lead of each operational amplifier $A_{41}$ and $A_{42}$ is substantially equal to the voltage on the noninverting input lead and substantially no current flows through resistors $R_{a4}$ to $R_{d4}$, the voltages $V_{DS41}$, $V_{DS42}$ and are given by the following equations:

$$V_{DS41} = I_l R_{41} \tag{9}$$

$$V_{DS42} = I_l R_{42} \tag{10}$$

$$V_{DC} = I_l R_{41} + I_l R_{42} + I_l R_{43} \tag{11}$$

$$V_{DC} = V_{DS41} + V_{DS42} + I_{ds} R_{44} \tag{12}$$

But it is also clear from equations (9), (10), (11) and (12) that $$V_{DC} = I_l(R_{41} + R_{42} + R_{43})$$

Substituting equations (9) and (10) into equation (12) and then solving for $I_l$ from equation (11) and substituting the result in equation (12) gives $V_{dc}$ in terms of $I_{ds}$ and resistors $R_{41}$, $R_{42}$, $R_{43}$ and $R_{44}$.

$$V_{DC} = I_{ds} R_{44}(R_{41} + R_{42} + R_{43})/R_{43}$$

Alternatively, the same result is obtained from equations (9) and (10) and an analysis of FIG. 5. Thus $$I_l R_{43} = I_{ds} R_{44} \tag{13}$$

Accordingly $$I_l = I_{ds} R_{44}/R_{43} \tag{14}$$

Combining equations (11) and (14) gives $$V_{DC} = I_{ds} R_{44}(R_{41} + R_{42} + R_{43})/R_{43} \tag{15}$$

Therefore, the biasing current $I_{ds}$ and the voltages $V_{DS41}$ and $V_{DS42}$ are given by the following equations respectively:

$$I_{ds} = V_{DC} R_{43}/[R_{44}(R_{41} + R_{42} + R_{43})] \tag{16}$$

Combining equations (9) and (14) gives $$V_{DS41} = I_{ds} R_{44} R_{41}/R_{43} \tag{17}$$

Combining equations (10) and (14) gives $$V_{DS42} = I_{ds} R_{44} R_{42}/R_{43} \tag{18}$$

Since $I_{ds}$ in equations (17) and (18) is defined by equation (16) in terms of resistors $R_{41}$, $R_{42}$, $R_{43}$, $R_{44}$ and the supply voltage $V_{DC}$, equations (17) and (18) can be rewritten $$V_{DS41} = R_{41}/(R_{41} + R_{42} + R_{43}) \tag{19}$$

and $$V_{DS42} = V_{DC} R_{42}/(R_{41} + R_{42} + R_{43}) \tag{20}$$

Hence $I_{ds}$, $V_{DS41}$ and $V_{DS42}$ can be defined by properly choosing $R_{41}$, $R_{42}$, $R_{43}$ and $R_{44}$ and the voltages $V_{DS41}$ and $V_{DS42}$ across JFETs 41 and 42 are independent of $R_{44}$, $I_{ds}$ and the particular JFETs used. Nowhere do $I_{dss}$ and $G_m$ defined in conjunction with equation 1 above enter into the design equations (equations 16, 19 and 20) for this embodiment.

The above description will suggest to others skilled in the art additional ways in which the principles of this invention may be used without departing from its spirit. The above description is meant to be illustrative and not limiting.

What is claimed is:

1. A biasing arrangement for a pair of junction field effect transistors ("JFETs") comprising:
   an input terminal for connecting to a first reference potential;

a first and a second JFET, each having a source, a drain, and a gate, said first and second JFET being of a first conductivity type;

means for connecting the source of said first JFET to said drain of said second JFET;

means for connecting the source of said second JFET through a resistor to a second reference potential;

means for connecting the gate of said second JFET to said second reference potential;

means for connecting the drain of said first JFET to said first reference potential;

voltage divider means connected between said first reference potential and said second reference potential; and means for connecting the gate of said first JFET to a selected point on said voltage divider means.

2. A biasing arrangement for a pair of junction field effect transistors ("JFETS") comprising:

an input terminal connected to a supply voltage;

a reference voltage;

a first and second JFET, each having a gate, a source and a drain;

means for connecting the drain of said first JFET to said supply voltage, means for connecting the source of said first JFET to the drain of said second JFET;

means for connecting the source of said second JFET to said reference voltage; and means for holding the voltage on the gate of said first JFET to a first selected value relative to the voltage on the source of said first JFET and for holding the voltage on the gate of said second JFET to a second selected value relative to the voltage on the source of said second JFET, said means for holding comprising a first resistor, a second resistor and a third resistor connected in series between said supply voltage and said reference voltage;

a first operational amplifier and a second operational amplifier, each operational amplifier having a noninverting input lead, an inverted input lead and an output lead; and means for connecting the noninverting input lead of said first operational amplifier to the node between said first resistor and said second resistor;

means for connecting the inverting input lead of said first amplifier to the source of said first JFET;

means for connecting the output of said first operational amplifier to the gate of said first JFET;

means for connecting the noninverting input lead of said second operational amplifier to the node between said second resistor and said third resistor;

means for connecting the inverting input lead of said second operational amplifier to the source of said second JFET, and means for connecting the output lead of said second operational amplifier to the gate of said second JFET.

3. The biasing arrangement as in claim 2 wherein said means for connecting the source of said second JFET to said reference voltage comprises a fourth resistor.

4. The biasing arrangement as in claim 2 wherein said first operational amplifier holds the voltage on the gate of said first JFET to a first selected value relative to the voltage on the source of said first JFET such that the voltage drop from the drain to source of said first JFET equals the voltage drop across said first resistor and wherein said second operational amplifier holds the voltage on the gate of said second JFET to a second selected value relative to the voltage on the source of said second JFET such that the voltage drop from the drain to source of said second JFET equals the voltage drop across said second resistor.

5. The biasing arrangement as in claim 2 wherein said means for connecting the noninverting input lead of said operational amplifier to the node between said first resistor and said second resistor comprises a first conductive lead; and said means for connecting the noninverting input lead of said second operational amplifier to the node between said second resistor and said third resistor comprises a second conductive lead.

6. The biases arrangement as in claim 3 wherein said means for connecting the inverting input lead of said first operational amplifier to the source of said first JFET comprises a fifth resistor;

said means for connecting the output lead of said first operational amplifier to the gate of said first JFET comprises a sixth resistor;

said means for connecting the inverting input lead of said second operational amplifier to the source of said second JFET comprises a seventh resistor; and said means for connecting the output lead of said second operational amplifier to the gate of said second JFET comprises an eighth resistor.

* * * * *